United States Patent
Andou et al.

(10) Patent No.: US 10,217,956 B2
(45) Date of Patent: Feb. 26, 2019

(54) DISPLAY DEVICE

(71) Applicant: Japan Display Inc., Tokyo (JP)

(72) Inventors: Naohisa Andou, Tokyo (JP); Kazuto Tsuruoka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/006,901

(22) Filed: Jun. 13, 2018

(65) Prior Publication Data

US 2018/0294433 A1 Oct. 11, 2018

Related U.S. Application Data

(63) Continuation of application No. 15/406,068, filed on Jan. 13, 2017, now Pat. No. 10,026,921.

(30) Foreign Application Priority Data

Feb. 26, 2016 (JP) .................................. 2016-035351

(51) Int. Cl.
*H01L 51/52* (2006.01)
*H01L 27/32* (2006.01)
*H01L 51/00* (2006.01)

(52) U.S. Cl.
CPC ...... *H01L 51/5237* (2013.01); *H01L 27/3276* (2013.01); *H01L 27/3279* (2013.01); *H01L 51/0097* (2013.01); *H01L 2251/5338* (2013.01); *Y02E 10/549* (2013.01)

(58) Field of Classification Search
CPC .................... H01L 51/5237; H01L 51/0097
See application file for complete search history.

(56) References Cited

U.S. PATENT DOCUMENTS

| 8,736,162 B2 | 5/2014 | Jin et al. |
| 8,936,952 B2 | 7/2015 | Chida |
| 9,448,592 B2 | 9/2016 | Jin et al. |
| 2006/0158108 A1 | 7/2006 | Hayashi |
| 2014/0306288 A1 | 10/2014 | Adachi et al. |
| 2015/0060832 A1 | 3/2015 | Ito et al. |
| 2015/0255740 A1 | 9/2015 | Nakada et al. |
| 2015/0380679 A1 | 12/2015 | Fujiyoshi et al. |

(Continued)

FOREIGN PATENT DOCUMENTS

| JP | 2013-015835 A | 1/2013 |
| JP | 2015-053137 A | 3/2015 |
| JP | 2015-072362 A | 4/2015 |

(Continued)

OTHER PUBLICATIONS

Korean Office Action dated on Sep. 29, 2017 for the corresponding Korean patent application No. 10-2016-0160083, with partial English Translation.

(Continued)

*Primary Examiner* — Douglas M Menz (74) *Attorney, Agent, or Firm* — TYPHA IP LLC (57) ABSTRACT

Provided is a display device including: a base material; a display region over the base material; a wiring over the base material, the wiring extending from the display region to an outside of the display region; and a pair of metal films over the base material, where the wiring is located between the pair of metal films in a plane view. The display region may be positioned between the pair of metal films, and the wiring and the pair of metal films may exist in the same layer.

9 Claims, 10 Drawing Sheets

(56) References Cited

U.S. PATENT DOCUMENTS

2016/0370827 A1    12/2016    Jin et al.

FOREIGN PATENT DOCUMENTS

| JP | 2015-180930 A | 10/2015 |
| KR | 10-2012-0000497 A | 1/2012 |
| KR | 10-2016-0000846 A | 1/2016 |

OTHER PUBLICATIONS

Japanese Office Action dated on Apr. 10, 2018 for the corresponding Japanese Patent Application No. 2016-035351, with partial English translation.
Korean Office Action dated on Apr. 25, 2018 for the corresponding Korean patent application No. 10-2016-0160083, with partial English translation.
Korean Office Action dated Dec. 10, 2018 for the corresponding Korean patent application No. 10-2016-0160083, with Machine Translation.

DISPLAY DEVICE

CROSS REFERENCE TO RELATED APPLICATIONS

This application is a continuation of U.S. application Ser. No. 15/406,068, filed Jan. 13, 2017. Further, this application is based on and claims the benefit of priority from the prior Japanese Patent Application No. 2016-035351, filed on Feb. 26, 2016, the entire contents of which are incorporated herein by reference.

FIELD

The present invention relates to a display device exemplified by a flexible EL display device.

BACKGROUND

As a typical example of a display device, a liquid crystal display device and an organic EL (electroluminescence) display device respectively having a liquid crystal element and a light-emitting element in each pixel are represented. These display devices have a display element such as a liquid crystal element and an organic light-emitting element (hereinafter, referred to as a light-emitting element) in each of a plurality of pixels formed over a substrate. A liquid crystal element and a light-emitting element include a liquid crystal and a layer containing an organic compound (hereinafter, referred to as an organic layer), respectively, between a pair of electrodes and are driven by applying a voltage or supplying a current to the pair of electrodes.

Since a light-emitting element is an all-solid display element, display quality is not influenced in principle even if a display device is provided with flexibility and folded or bent. This feature has been utilized to fabricate a so-called flexible display (sheet display) in which a light-emitting element is formed over a flexible substrate. For example, a flexible organic EL display device which is foldable is disclosed in Japanese patent application publication 2013-15835.

SUMMARY

An embodiment of the present invention is a display device including: a base material; a display region over the base material; a wiring over the base material, the wiring extending from the display region to outside of the display region; and a pair of metal films over the base material, where the wiring is located between the pair of metal films.

An embodiment of the present invention is a display device including: a base material; a display region over the base material; a wiring over the base material, the wiring extending from the display region to an outside of the display region; and a metal film over the base material in a plane view. The base material is configured to provide a bent region which is folded and two flat regions sandwiching the bent region, and the metal film extends through the bent region and the two flat regions.

DESCRIPTION OF EMBODIMENTS

Hereinafter, the embodiments of the present invention are explained with reference to the drawings. Note that the present invention can be implemented in a variety of modes within the concept of the invention, and the interpretation should not be limited by the disclosure in the embodiments represented below.

In the drawings, the width, thickness, shape, and the like of each component may be schematically illustrated and different from those of an actual mode in order to provide a clearer explanation. However, the drawings simply give an example and do not limit an interpretation of the present invention. In the specification and each of the drawings, elements which are the same as those explained in the preceding drawings are denoted with the same reference numbers, and their detailed explanation may be omitted appropriately.

In the present invention, when a plurality of films is formed by processing a single film, the plurality of films may have functions or roles different from each other. However, the plurality of films originates from the film which is formed as the same layer in the same process. Therefore, the plurality of films is defined as the films existing in the same layer.

First Embodiment

In the present embodiment, a display device according to an embodiment of the present invention is explained by using FIG. 1 to FIG. 4B.

Figure 1:
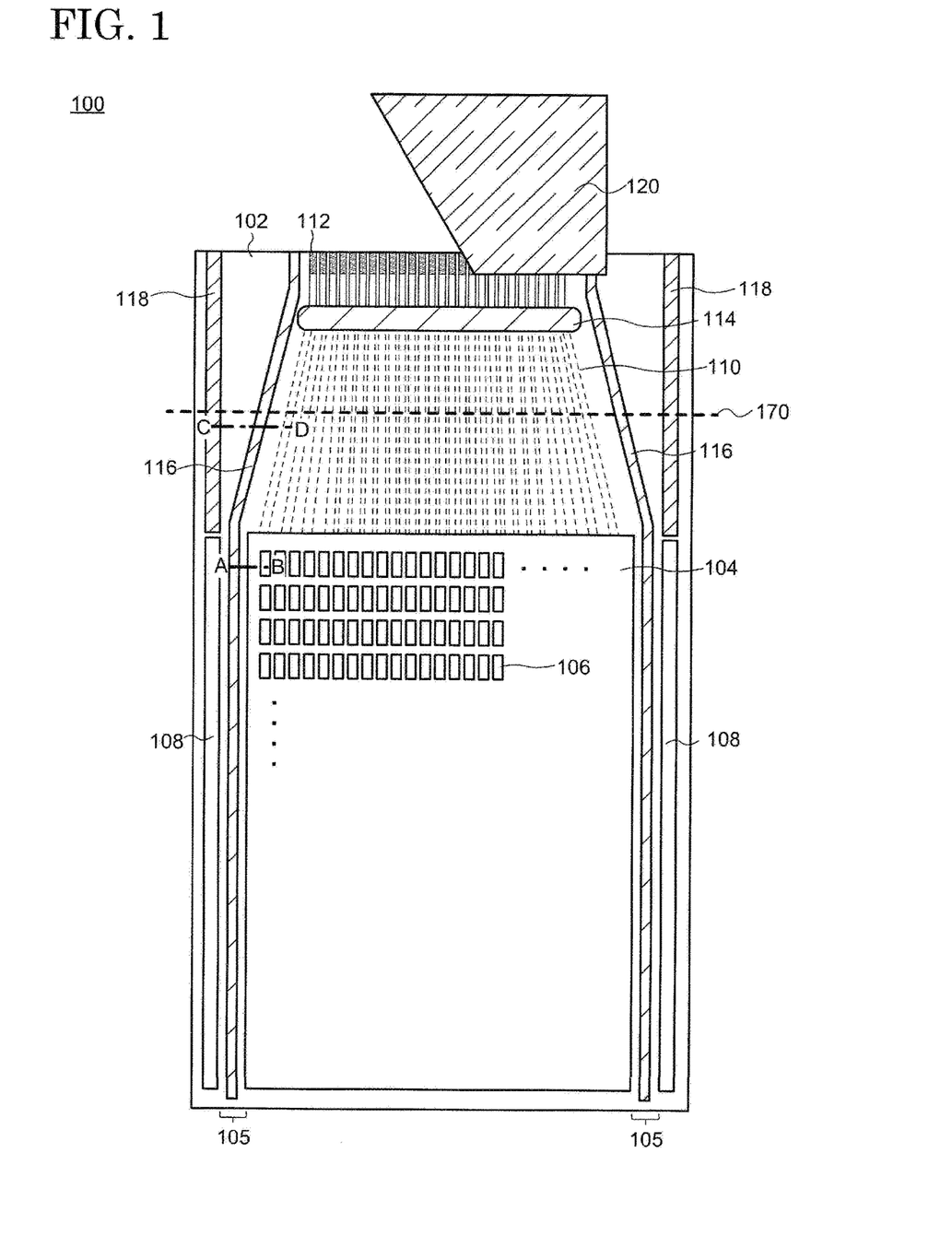
FIG. 1 is a schematic top view of a display device according to an embodiment.

A top view of the display device 100 according to the present embodiment is shown in FIG. 1. The display device 100 has a display region 104 including a plurality of pixels 106 and a gate side driver circuit (hereinafter, referred to as a driver circuit) 108 over one surface (top surface) of a base material 102. The pixels 106 are arranged in a matrix form. Wirings 110 extend from the display region 104 to a side surface of the base material 102 (a short side of the display device 100 in the drawing). The wirings 110 are exposed at an edge portion of the base material 102, and the exposed portions form terminals 112. The terminals 112 are connected to a connector 120 such as a flexible printed circuit (FPC) by which the connector 120 is electrically connected to the display region 104 through the wirings 110. In the present embodiment, two driver circuits 108 are disposed so as to sandwich the display region 104. However, one driver circuit 108 may be provided. Additionally, the driver circuit 108 may not be formed over the base material 102, and a driver circuit formed over another substrate may be formed over the connector 120, for example. Note that a part of the connector 120 is not illustrated in FIG. 1 in order to promote understanding.

The display region 104 is also electrically connected to an IC chip 114 through the wirings 110. Image signals supplied from an external circuit (not shown) are provided to the pixels 106 via the driver circuits 108 and the IC chip 114 by which light emission of the pixels 106 is controlled, and an image is reproduced on the display region 104. Although not shown, the display device 100 may possess, for example, a source side driver circuit instead of the IC chip 114 at a periphery of the display region 104.

Flexibility can be provided to the whole of the display device 100 by using a film with flexibility as the base material 102 by which the display device 100 can be deformed by folding or bending the display device. The flexible base material 102 may also be called a base film.

A light-emitting element is disposed in each pixel 106. For example, arrangement of red-emissive, green-emissive, and blue-emissive light-emitting elements in the respective pixels 106 enables full-color display. Alternatively, a white-emissive light-emitting element may be used in all pixels 106, and full-color display may be performed by extracting red, green, and blue colors from the respective pixels 106 by using a color filter. The color finally extracted is not limited to a combination of red, green, and blue colors, and four kinds of colors of red, green, blue, and white can be extracted from the pixels 106, for example. The arrangement of the pixels 106 is also not limited, and a stripe arrangement, a delta arrangement, a mosaic arrangement, and the like can be employed.

The display device 100 further possesses a power source line 116 over the base material 102. As described below, the light-emitting element provided in each pixel 106 has a pair of electrodes sandwiching an organic layer, and one electrode is formed to cover the organic layer, while being electrically connected to the power source line 116. The power source line 116 also extends to the side surface of the base material 102 and is electrically connected to the connector 120 at the edge portion.

The display device 100 is provided with a metal film 118 along the side surface (long side of the display device 100 in the drawing) different from the side surface of the base material 102 used for the connection with the connector 120. Two metal films 118 are disposed to form a pair in the present embodiment, and the wirings 110 are arranged so as to be sandwiched between the pair of metal films 118. Furthermore, the power source line 116 is arranged so as to be sandwiched by the pair of metal films 118. The metal films 118 may be electrically floated or applied with a constant potential. As shown in FIG. 1, the metal films 118 are preferably arranged so as to reach the side surface of the base material 102 used for the connection with the connector 120.

Figure 2:
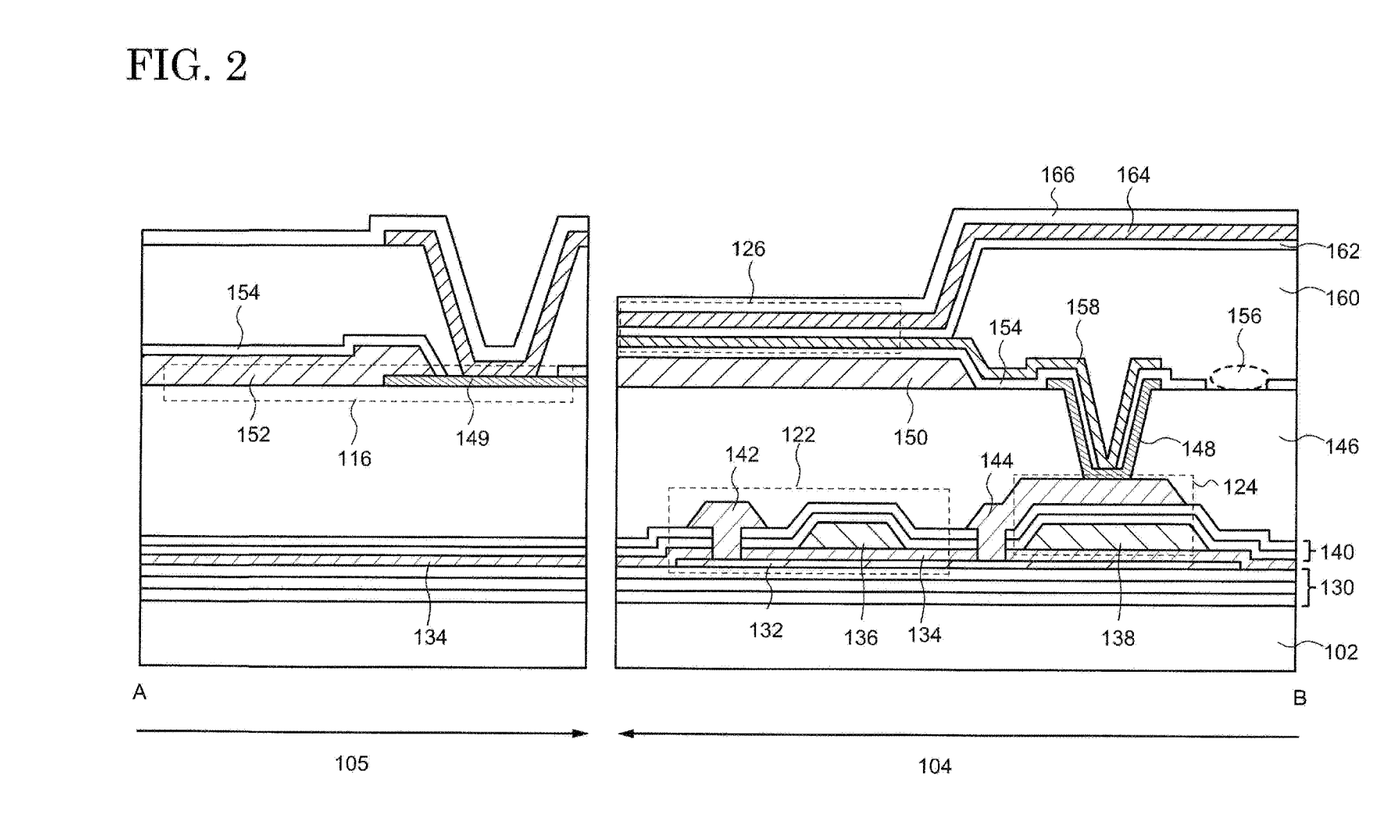
FIG. 2 is a schematic cross-sectional view of a display device according to an embodiment.
Figure 3:
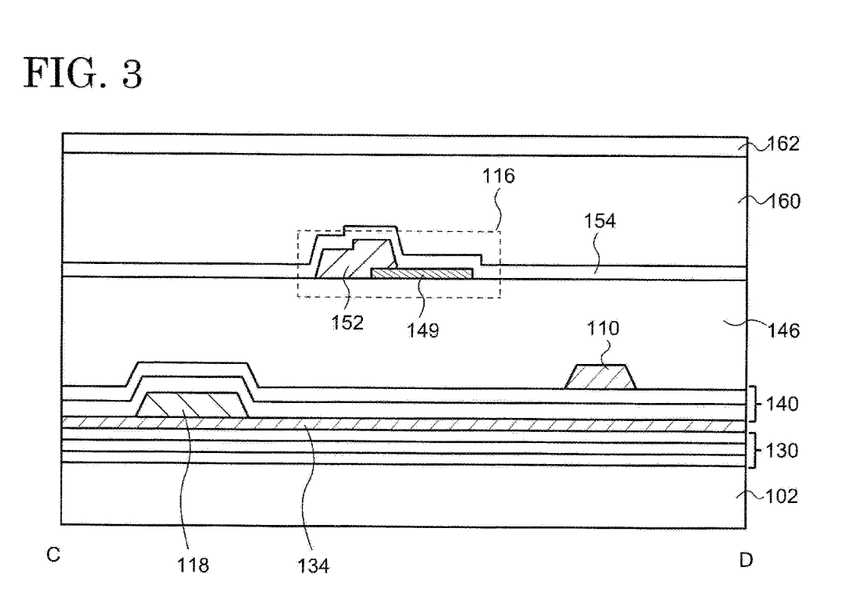
FIG. 3 is a schematic cross-sectional view of a display device according to an embodiment.

Schematic cross-sectional views along straight lines A-B and C-D shown in FIG. 1 are given in FIG. 2 and FIG. 3, respectively. In the cross section A-B of FIG. 2, the display region 104 and a region (contact region) 105 used for the connection of one electrode of the light-emitting element with the power source line 116 are illustrated.

As shown in FIG. 2, elements such as a transistor 122, a capacitor 124, and the light-emitting element 126 are disposed in the pixel 106 in the display region 104. The configuration of each element in the pixel 106 is not limited to such a configuration, and the pixel 106 may include a plurality of transistors and a plurality of capacitors.

Referring to FIG. 2, a semiconductor film 132 is formed over the base material 102 with a base film 130 interposed therebetween. As a material usable for the base material 102, glass, quartz, a metal, and the like are represented. When flexibility is provided to the display device 100, a polymer material such as a polyimide, a polyester, and an acrylic resin can be used for the base material 102, for example. The base film 130 can include an inorganic material such as silicon oxide, silicon nitride, silicon oxynitride, and silicon nitride oxide and can be formed with a chemical vapor deposition method (CVD method), a sputtering method, and the like. In FIG. 2, an example is illustrated in which the base film 130 has a three-layer structure. In such a case, the base film 130 may be formed, for example, by stacking a silicon oxide film, a silicon nitride film, and a silicon oxide film in this order. The lowest silicon oxide film is provided to improve adhesion with the base material 102, the middle silicon nitride layer is provided as a blocking film to prevent entrance of impurities such as water from outside, and the upmost silicon oxide film is provided as a blocking film to prevent diffusion of hydrogen atoms included in the silicon nitride film to the elements such as the transistor 122. However, the base film 130 is not particularly limited to this structure. Another layer may be additionally stacked, and the base film 130 having a single-layer or two-layer structure may be used.

The semiconductor film 132 can be formed with silicon or a metal oxide exhibiting a semiconductor property by applying a CVD method, a sputtering method, and the like. There is no limitation to the crystallinity of the semiconductor film 132, and the semiconductor film 132 may have any crystal state selected from amorphous, polycrystalline, microcrystalline, and single crystalline states.

The display device 100 possesses a gate insulating film 134 over the semiconductor film 132. An inorganic compound such as silicon oxide, silicon nitride, silicon oxynitride, and silicon nitride oxide can be used for the gate insulating film 134, and the gate insulating film 134 can be formed by applying a CVD method, a sputtering method, and the like. A first metal layer is formed over the gate insulating film 134, and etching processing thereof allows the formation of a gate electrode 136 of the transistor 122 and one electrode 138 of the capacitor 124 in the pixel 106. Therefore, the gate electrode 136 and the electrode 138 exist in the same layer.

The first metal layer can be formed with a metal or an alloy by applying a sputtering method and the like. As a metal, aluminum, copper, titanium, tungsten, molybdenum, tantalum, and the like can be used, and the first metal layer may be formed in a single-layer structure or a stacked-layer structure. For example, a stacked layer of titanium and aluminum and a structure in which a highly conductive metal such as aluminum and copper is sandwiched by a metal with a high melting point, such as titanium and molybdenum, can be employed. Since the gate electrode 136 and the electrode 138 exist in the same layer, both have the same layer structure and include the same material.

The semiconductor film 132 may have a source-drain region doped with an impurity and a channel region. In this case, the impurity is doped by using the gate electrode 136 as a mask. The semiconductor film 132 may further include, between the channel region and the source-drain region, a region (low-concentration impurity region) doped with an impurity at a concentration lower than that of the source-drain region.

An interlayer film 140 is disposed over the gate electrode 136 and the electrode 138. The interlayer film 140 can be formed by using the material usable in the base film 130 and the gate insulating film 134 as a single-layer structure or a stacked-layer structure. For example, the interlayer film 140 may be formed as a stacked-layer structure of a silicon nitride film and a silicon oxide film. The interlayer film 140 has a function to protect the transistor 122 and simultaneously has a function as a dielectronic film of the capacitor 124.

The display device further possesses a source electrode 142 and a drain electrode 144 over the interlayer film 140. The source electrode 142 and the drain electrode 144 are electrically connected to the semiconductor film 132 in opening portions provided in the interlayer film 140 and the gate insulating film 134. The transistor 122 is constructed by the semiconductor film 132, the gate insulating film 134, the gate electrode 136, the source electrode 142, and the drain electrode 144. Note that the drain electrode 144 is also formed over the electrode 138, and the capacitor 124 is structured by the electrode 138, the interlayer film 140 and a portion of the drain electrode 144, which overlaps with the electrode 138. The source electrode 142 and the drain electrode 144 are formed by forming a second metal layer over the interlayer film 140, followed by performing etching processing. Hence, the source electrode 142 and the drain electrode 144 exist in the same layer. The second metal layer can be formed with a material usable in the first metal layer by applying a CVD method, a sputtering method, and the like. For example, a stacked-layer structure in which an aluminum film is sandwiched by titanium films can be employed.

Note that the wirings 110 shown in FIG. 1 can also be formed simultaneously with the source electrode 142 and the drain electrode 144 (see FIG. 3). Therefore, the wirings 110 can exist in the same layer as the source electrode 142 and the drain electrode 144.

A leveling film 146 is provided over the source electrode 142 and the drain electrode 144 in order to absorb steps caused by the transistor 122 and the capacitor 124 and give a flat top surface. The leveling film 146 can be formed with a polymer material such as an acrylic resin, a polyimide, and a polysiloxane by applying a spin-coating method, an ink-jet method, a printing method, a dip-coating method, and the like. As shown in FIG. 2, the base film 130, the gate insulating film 134, the interlayer film 140, and the leveling film 146 are provided not only in the display region 104 but also in the contact region 105. Note that, although the semiconductor film 132 is not included in the contact region 105 of the present embodiment, the semiconductor film 132 may be formed in the contact region 105.

The display device 100 has connection wirings 148 and 149 over the leveling film 146. In the contact region 105, the connection wring 149 is formed over the flat top surface of the leveling film 146. In the display region 104, the connection wiring 148 is formed so as to cover an opening portion which is formed in the leveling film 146 and reaches the drain electrode 144. Although not shown, the leveling film 146 over the terminals 112 shown in FIG. 1 is also removed simultaneously when the opening portion is formed. The connection wirings 148 and 149 can be formed by forming, over the leveling film 146, a film containing a conductive oxide with a light-transmitting property, such as indium-tin oxide (ITO) and indium-zinc oxide (IZO), under the application of a sputtering method and the like, followed by performing etching processing thereon, for example. Thus, the connection wirings 148 and 149 exist in the same layer. Note that the conductive oxide with a light-transmitting property is also formed over the terminals 112 simultaneously when the connection wirings 148 and 149 are formed, which allows a stable electrical connection between the terminals 112 and the connector 120.

The display device 100 further possesses a capacitor wiring 150 and an auxiliary wiring 152 in the display region 104 and the contact region 105, respectively. These wirings are formed by forming a third metal layer and then performing etching processing. Hence, the capacitor wiring 150 and the auxiliary wiring 152 exist in the same layer. In the contact region 105, the auxiliary wiring 152 and the connection wiring 149 are electrically connected to each other and form the power source line 116. The third metal layer can be formed with a metal such as aluminum, copper, titanium, molybdenum, tungsten, and tantalum or an alloy thereof so as to have a single-layer structure or a stacked-layer structure. For example, a stacked-layer structure of molybdenum/aluminum/molybdenum can be applied. When the connection wirings 148 and 149 are formed with a conductive oxide having a light-transmitting property, such as ITO and IZO, relatively high resistance of the connection wirings 148 and 149 causes a voltage drop in the contact region 105. However, the formation of the auxiliary wiring 152 suppresses the voltage drop. Note that the connection wiring 148 is not necessarily provided in the display region 104. However, the arrangement of the connection wiring 148 allows the drain electrode 144 of the transistor 122 to be protected when the capacitor wiring 150 and the auxiliary wiring 152 are formed, thereby preventing an increase in contact resistance.

The display device 100 further includes an insulating film 154 over the capacitor wiring 150 and the auxiliary wiring 152. The insulating film 154 can be formed by using a material such as silicon nitride which is usable in the gate insulating film 134 and the interlayer film 140. The insulating film 154 has opening portions to expose a contact portion for the electrical connection between the transistor 122 and the light-emitting element 126 (i.e., a bottom surface of the connection wiring 148 formed in the opening portion of the leveling film 146), a part of the power source line 116, and a part of the surface of the leveling film 146.

The display device 100 further has the first electrode 158, the organic layer 162, and the second electrode 164 which configure the light-emitting element 126. When the light-emission from the light-emitting element 126 is extracted through the base material 102, a material with a light-transmitting property exemplified by a conductive oxide such as ITO and IZO can be used for the first electrode 158. On the other hand, when the light-emission from the light-emitting element 126 is extracted from a second electrode 164 side, a metal such as aluminum and silver or an alloy thereof can be used. Alternatively, a stacked layer of the aforementioned metal or alloy and a conductive oxide, such as a stacked-layer structure in which a metal is sandwiched by a conductive oxide (e.g., ITO/silver/ITO), can be employed. Note that a capacitor is additionally formed by the first electrode 158, the capacitor wiring 150, and the insulating film 154 interposed therebetween.

When the light-emission from the light-emitting element 126 is extracted through the base material 102, the second electrode 164 can be formed by using a metal such as aluminum and silver or an alloy thereof. On the contrary, when the light-emission from the light-emitting element 126 is extracted through the second electrode 164, the second electrode 164 may be formed with the aforementioned metal or alloy to have a thickness which allows visible light to pass therethrough. Alternatively, the second electrode 164 may be formed with a material having a light-transmitting property, such as a conductive oxide exemplified by ITO and IZO. Furthermore, a stacked-layer structure of the aforementioned metal or alloy and a conductive oxide (e.g., Mg—Ag/ITO etc.) can be employed as the second electrode 164.

Here, a partition wall 160 is provided over the first electrode 158 in order to absorb steps caused by an edge portion of the first electrode 158 and the opening portion provided in the leveling film 146 and to electrically insulate the first electrodes 158 of the adjacent pixels 106 from each other. The partition wall 160 is also called a bank (rib). The partition wall 160 can be formed with a material usable in the leveling film 146. The partition wall 160 has an opening portion to expose the first electrode 158 and a part of the power source line 116, and an edge portion thereof preferably has a moderately tapered shape. A steep incline of the edge portion of the opening portion with respect to the first electrode 158 readily leads to a coverage defect of the organic layer 162 and the second electrode 164. The leveling film 146 and the partition wall 160 contact with each other via the opening 156 formed in the insulating film 154. The use of such a structure allows a gas such as vapor, which is eliminated from the leveling film 146 in a heating treatment and the like conducted after the formation of the partition wall 160, to be released through the partition wall 160.

In FIG. 2, the organic layer 162 is illustrated so as to have a single-layer structure. However, the organic layer 162 may have a structure in which a plurality of layers is stacked. For example, the organic layer 162 can include a layer such as a charge-injection layer, a charge-transporting layer, an emission layer, a charge-blocking layer, and a charge-generation layer as appropriate. It is possible to employ the organic layer 162 with the same structure in all pixels 106, and organic layers with different structures may be used in the adjacent pixels 106. The organic layer 162 can be formed with an evaporation method, an ink-jet method, a printing method, a spin-coating method, and the like. Carriers (holes and electrons) are injected from the first electrode 158 and the second electrode 164 into the organic layer 162, and the light-emission can be obtained through a process in which an excited state obtained by carrier recombination relaxes to a ground state. Hence, a region of the light-emitting element 126, in which the organic layer 162 and the first electrode 158 are in direct contact with each other, is an emission region.

The second electrode 164 of the light-emitting element 126 extends to the contact region 105 and is electrically connected to the connection wiring 149. Hence, when the first electrode 158 functions as an anode, the current supplied through the transistor 122 flows in the first electrode 158, the organic layer 162, the second electrode 164, and the power source line 116 in this order.

The display device 100 further includes a protection film 166 (passivation film) over the second electrode 164. The protection film 166 has a function to prevent moisture from entering to the light-emitting element 126 from outside and preferably has a high gas-barrier property. For example, it is preferred that the protection film 166 be prepared by using an inorganic material such as silicon nitride, silicon oxide, silicon nitride oxide, and silicon oxynitride. Alternatively, an organic resin including an acrylic resin, a polysiloxane, a polyimide, a polyester may be used. For instance, a stacked-layer structure of a film formed with an inorganic material and a film formed with an organic resin may be employed. Specifically, a stacked-layer structure of silicon nitride, silicon oxide, an acrylic resin, and silicon nitride is represented. Each of these layers may be formed with an evaporation method, a CVD method, a sputtering method, and the like.

As an optional structure, the display device 100 may have an opposing substrate over the protection film 166. The opposing substrate is fixed to the base material 102 through the protection film 166 by using an adhesive. In this case, the display device 100 may contain an inert gas or a filler such as a resin in a space between the opposing substrate and the protection film 166. When a filler is included, the filler preferably has high transparency with respect to visible light. The opposing substrate may have a light-shielding film having an opening in a region overlapping with the emission region and a color filter in a region overlapping with the emission region. The light-shielding film is formed with a metal having a relatively low reflectance, such as chromium and molybdenum, or a resin material containing a coloring material of black or a similar color and has a function to block scattered light and reflected ambient light other than the light directly obtained from the emission region. Optical properties of the color filter may be changed in every pixel 106, and the color filter may be formed so as to extract red, green, and blue emissions, for example. The light-shielding film and the color filter may be provided to the opposing substrate with a base film interposed therebetween. An overcoat may be further disposed so as to cover the light-shielding film and the color filter.

When the display device 100 possesses the opposing substrate, the opposing substrate and the base material 102 are bonded with an adhesion arranged at a periphery of the display region 104 so that the light-emitting element 126 is sandwiched between the opposing substrate and the base material 102. The adhesive may contain a spacer to adjust an interval between the opposing substrate and the base material 102. Alternatively, the display device 100 may have a structural member serving as a spacer between the pixels 106 in the display region 104.

Referring to FIG. 3, the metal film 118 is formed over the gate insulating film 134 formed in the transistor 122. This metal film 118 can also be prepared by performing etching processing on the first metal layer. Therefore, the metal film 118 exists in the same layer as the gate electrode 136 of the transistor 122 and the electrode 138 of the capacitor 124. Specifically, the metal film 118, the gate electrode 136 of the transistor 122, and one electrode 138 of the capacitor 124 are disposed between two insulating films (gate insulating film 134 and interlayer film 140). As described above, the wirings 110 are arranged over the interlayer film 140 and can be formed by performing etching processing on the second metal layer. Hence, the wirings 110 exist in the same layer as the source electrode 142 and the drain electrode 144 of the transistor 122. The power source line 116 is formed over the leveling film 146 over which the insulating film 154, the partition wall 160, and the protection film 166 are arranged.

Figure 4A:
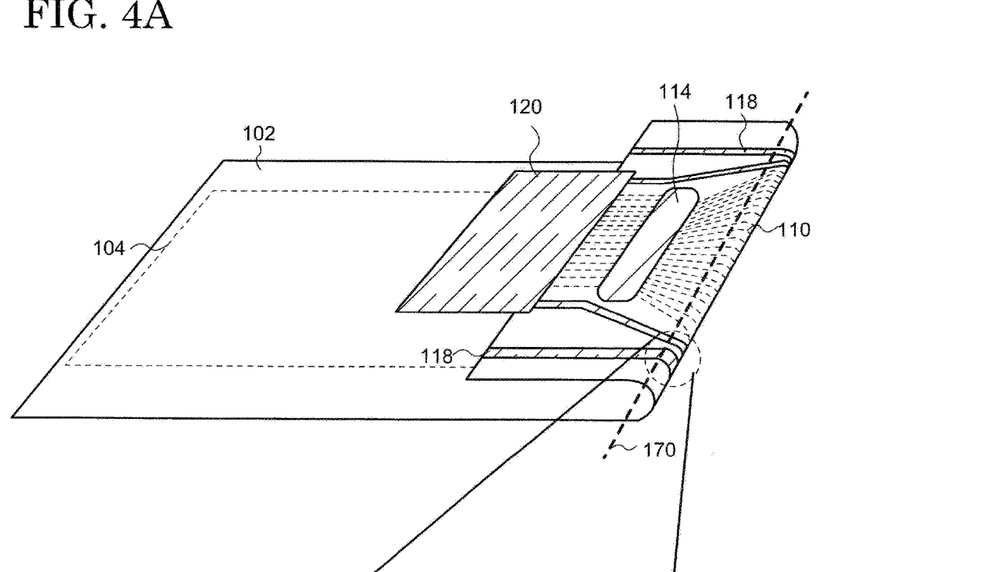
FIG. 4A and FIG. 4B are a perspective view and a top view of a display device according to an embodiment, respectively.
Figure 4B:
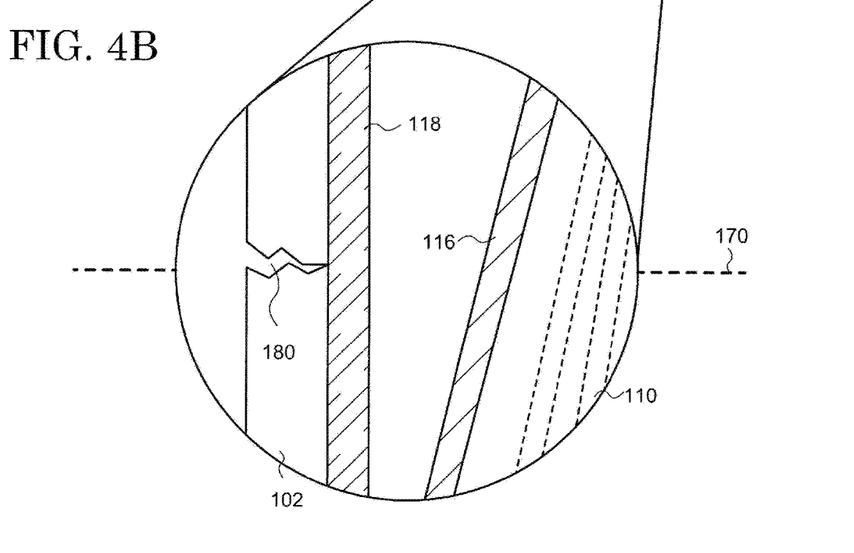

As described above, the use of the flexible base material 102 enables flexibility to be provided to the whole of the display device 100. For example, as shown in FIG. 4A, the display device 100 can be folded by using an imaginary axis 170 shown in FIG. 1 as a center so that the display region 104 is positioned outside. Here, the axis 170 is an axis of the bent region and a circumference of the axis has at least a part of the bent region. In this case, as shown in FIG. 4A, a bent region and two flat regions sandwiching the bent region are formed, where the bent region is positioned between the display region 104 and the connector 120 and the display region 104 and the terminals 112 are located in the two flat regions. When the display device 100 is thus folded, the largest stress is applied to the bent region. Therefore, this region is readily damaged when being bent. Damage tends to occur at the edge portion of the base material 102, and a crack 180 is caused from the edge portion of the base material 102 in a region close to the axis 170 as shown in FIG. 4B. The crack 180 extends inside from the edge portion of the base material 102, which induces damage and disconnection of the power source line 116 and the wirings 110.

The display device 100 of the present embodiment has the pair of metal films 118 so that the wirings 110 and the power source line 116 are sandwiched between the pair of metal films 118. Furthermore, the metal films 118 are arranged so as to overlap or intersect with the axis 170 about which the display device 100 is to be folded. In FIG. 1, the metal films 118 extend in a direction perpendicular to the axis 170. When the display device 100 having such a structure is folded, the metal films 118 are included not only in the flat regions but also in the bent region. In this case, even if the crack 180 is caused at the edge portion of the base material 102, extension of the crack 180 is terminated or an extension rate of the crack 180 is markedly decreased when the crack 180 reaches the metal films 118. Hence, damage and disconnection of the power source line 116 and the wirings 110 can be prevented, which enables improvement of reliability of the display device 100.

Second Embodiment

In the present embodiment, a display device according to an embodiment of the present invention is explained by using FIG. 5A to FIG. 7. Explanation of the structures which are the same as those of the First Embodiment is omitted.

In the First Embodiment, the metal films 118 exist in the same layer as the gate electrode 136 of the transistor 122 included in the pixel 106, whereas the wirings 110 electrically connecting the connector 120 and the display region 104 exist in the same layer as the source electrode 142 and the drain electrode 144 of the transistor 122. In the present embodiment, the positional relationship between the metal films 118, the wirings 110, and the power source line 116 is different from that of the First Embodiment.

Figure 5A:
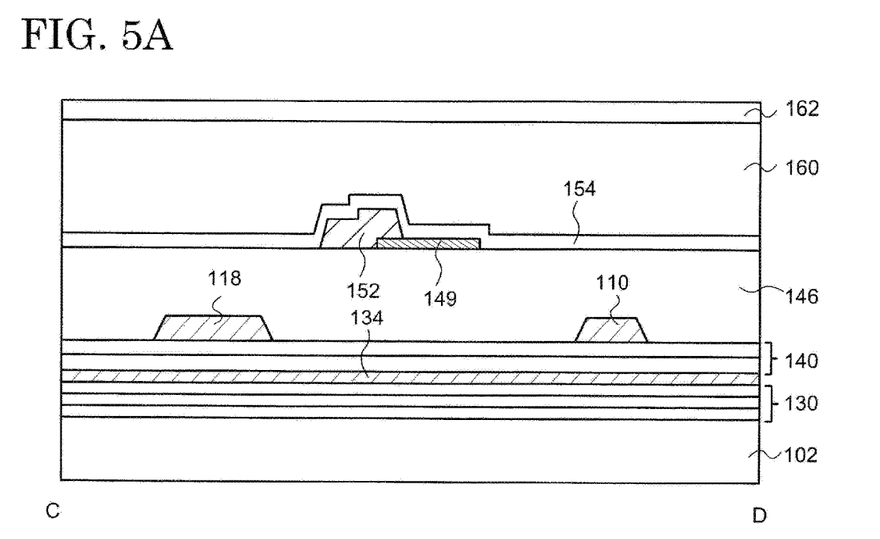
FIG. 5A and FIG. 5B are cross-sectional views of a display device according to an embodiment.

Specifically, as shown in FIG. 5A, the metal films 118 can exist in the same layer as the wirings 110 and arranged over the interlayer film 140 of the transistor 122 and under the leveling film 146. Hence, the metal films 118 can exist in the same layer as the source electrode 142 and the drain electrode 144 of the transistor 122.

Figure 5B:
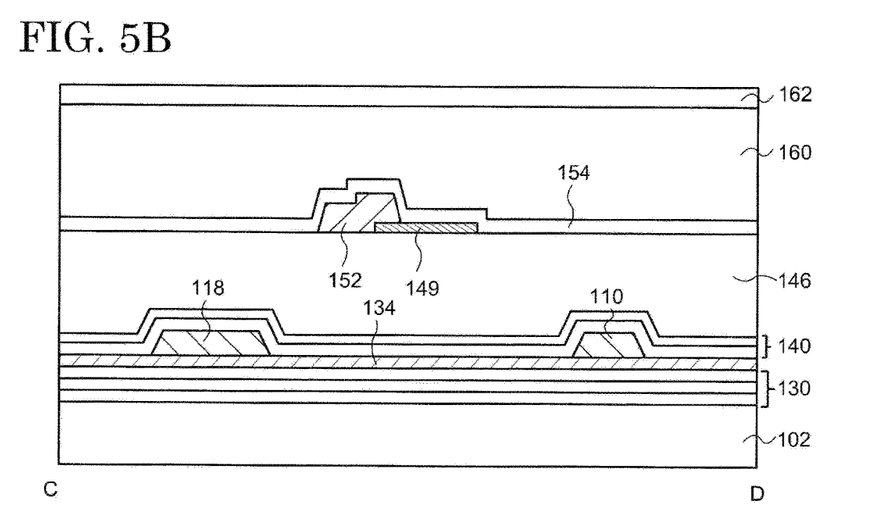

Alternatively, as shown in FIG. 5B, it is possible to arrange the metal films 118 over the gate insulating film 134 of the transistor 122 and under the interlayer film 140 although the metal films 118 exist in the same layer as the wirings 110. Therefore, the metal films 118 can exist in the same layer as the gate electrode 136 of the transistor 122.

Figure 6A:
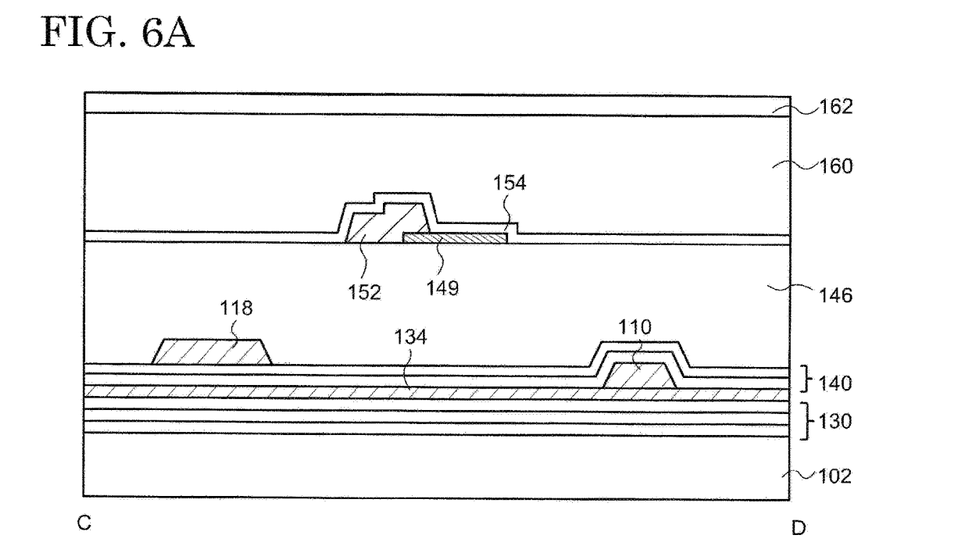
FIG. 6A and FIG. 6B are cross-sectional views of a display device according to an embodiment.

Alternatively, as shown in FIG. 6A, it is also possible to arrange the metal films 118 between the interlayer film 140 and the leveling film 146 and arrange the wirings 110 between the gate insulating film 134 and the interlayer film 140 although the metal films 118 and the wirings 110 exist in different layers from each other. In other words, the metal films 118 can exist in the same layer as the source electrode 142 and the drain electrode 144 of the transistor 122.

Figure 6B:
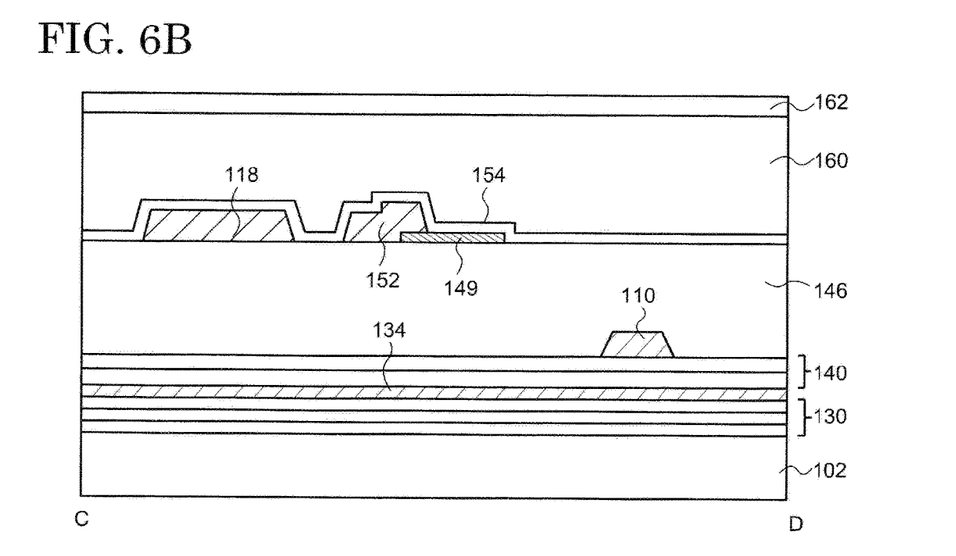

Alternatively, as shown in FIG. 6B, it is also possible to arrange the metal films 118 between the leveling film 146 and the insulating film 154 although the metal films 118 and the wirings 110 exist in different layers from each other. In other words, the metal films 118 can exist in the same layer as the power source line 116 or the auxiliary wiring 152 of the power source line 116.

Figure 7:
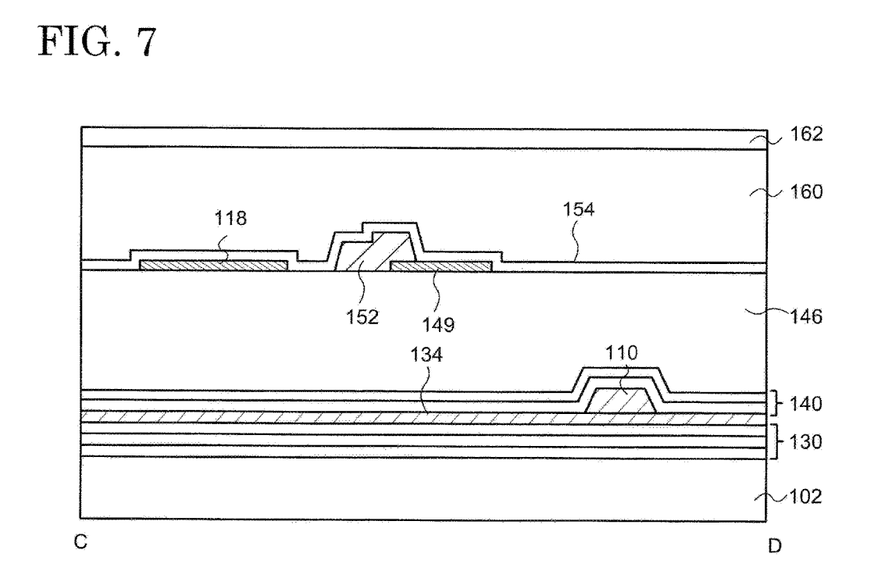
FIG. 7 is a cross-sectional view of a display device according to an embodiment.

Alternatively, as shown in FIG. 7, it is also possible to arrange the metal films 118 between the leveling film 146 and the insulating film 154 so as to exist in the same layer as the connection wiring 149 although the metal films 118 and the wirings 110 exist in different layers from each other.

Similar to the First Embodiment, the display device 100 of the present embodiment has the metal films 118, and the wirings 110 and the power source line 116 are arranged in a position that is far from the edge portion of the base material 102 compared with the metal films 118. Therefore, in the case where the base material 102 has flexibility, even if the crack 180 is caused at the edge portion of the base material 102 by deforming the display device 100, extension of the crack 180 is terminated or an extension rate of the crack 180 is markedly decreased when the crack 180 reaches the metal films 118. Hence, damage and disconnection of the power source lines 116 and the wirings 110 can be prevented, which enables improvement of reliability of the display device 100.

Third Embodiment

Figure 8A:
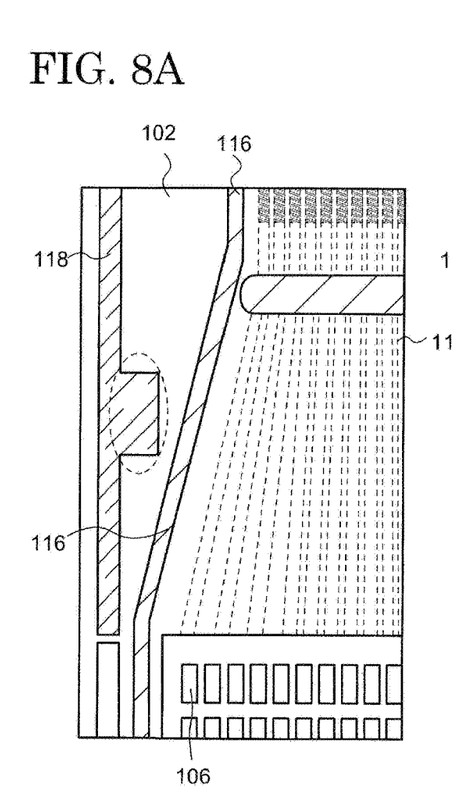
FIG. 8A to FIG. 8C are top views of a display device according to an embodiment.
Figure 8B:
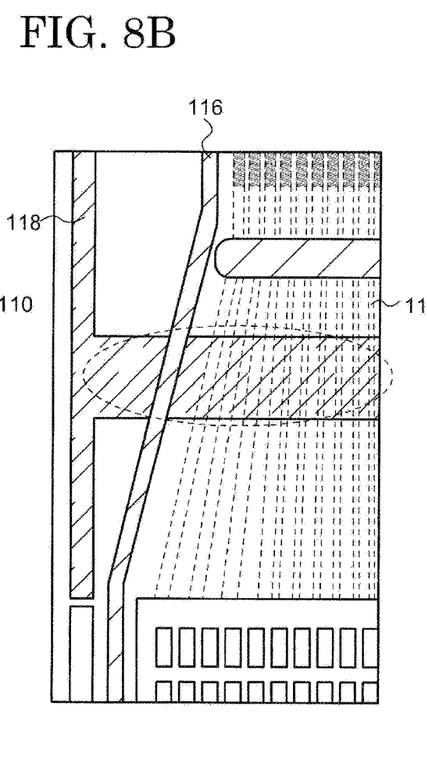
Figure 8C:
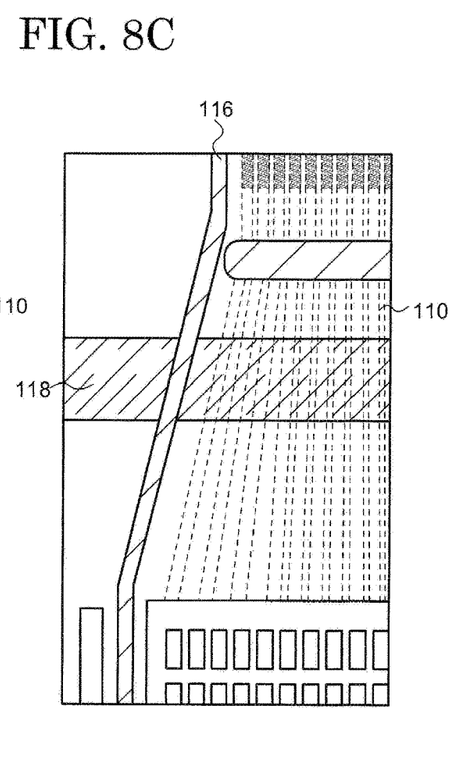

In the present embodiment, a display device according to an embodiment of the present invention is explained by using FIG. 8A to FIG. 8C. Explanation of the structures which are the same as those of the First and Second Embodiments is omitted.

The metal films 118 of the present embodiment are different in plane shape from that of the First or Second Embodiment. Specifically, as shown in a region surrounded by a dotted ellipse in FIG. 8A, the metal films 118 can have a projected portion in a direction intersecting with the wirings 110. Although the projected portion has a shape protruding to a direction opposing the edge portion of the base material 102 in FIG. 8A, the metal films 118 may have the projected portion protruding in a direction to the edge portion. In this case, the projected portion may reach the edge portion of the base material 102. Furthermore, the metal films 118 may have a projected portion extending in both a direction to the edge portion of the base material 102 and a direction to the wirings 110.

Alternatively, as shown in FIG. 8B, the metal films 118 may be arranged so that at least a part of the metal films 118 intersects with the wirings 110 and the power source lines 116. In this case, the metal films 118 may be arranged so that a part of the metal films 118 perpendicularly intersects with the wirings 110, the power source line 116, or a part of these wirings. Additionally, the pair of metal films 118 shown in FIG. 1 may be connected to each other. Alternatively, as shown in FIG. 8C, the whole of the metal films 118 may extend in a direction intersecting with the wirings 110 or may be arranged so as to perpendicularly intersect with the wirings 110 and the power source line 116.

When the display device 100 is intended to be folded, the metal films 118 having the shapes shown in the present embodiment are provided in a portion giving the bent region, by which the metal films 118 can be arranged in parallel to the axis 170 about which the display device 100 is folded. Hence, even if the crack 180 is caused at the edge portion of the base material 102 in the bent region, the extension of the crack 180 can be effectively and certainly prevented, which enables production of a flexible display device with high reliability.

Fourth Embodiment

Figure 9:
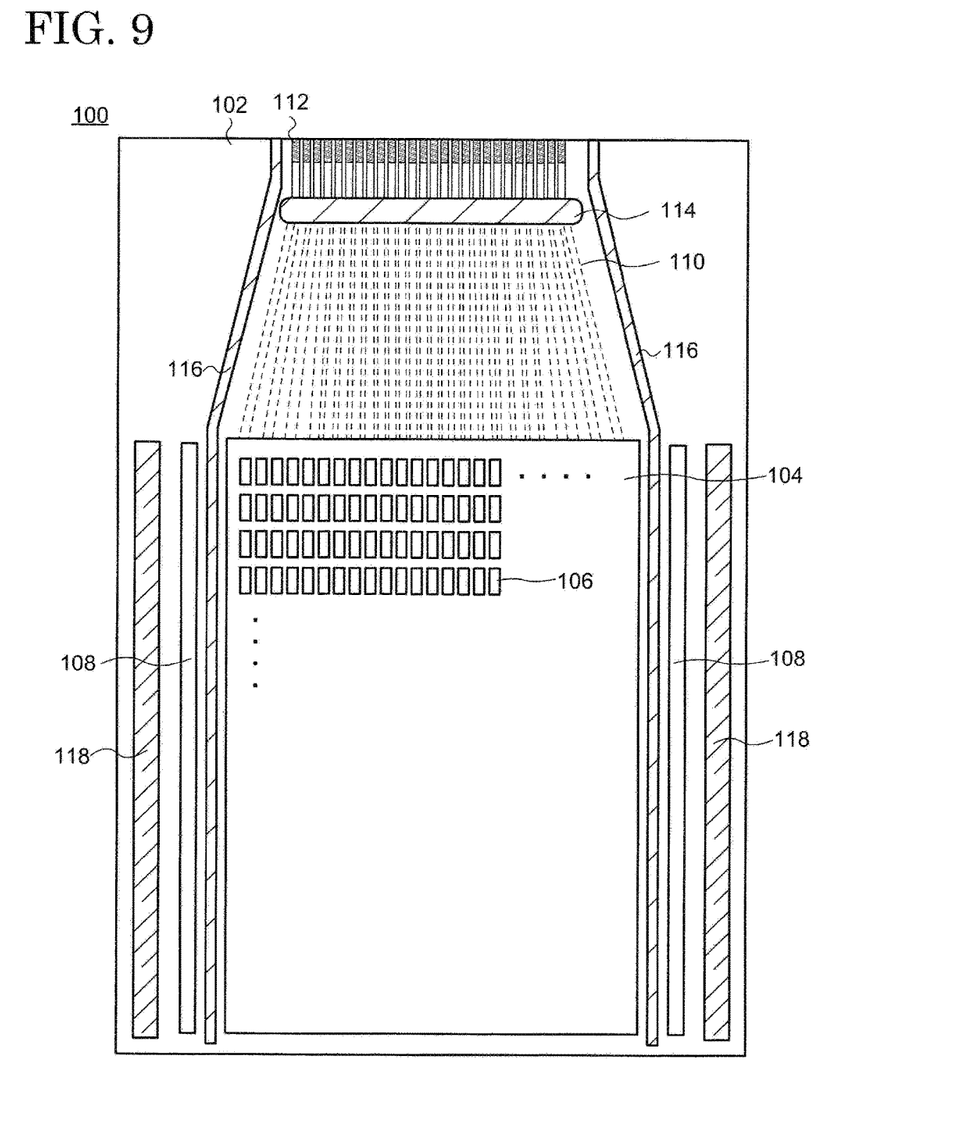
FIG. 9 is a top view of a display device according to an embodiment.
Figure 10:
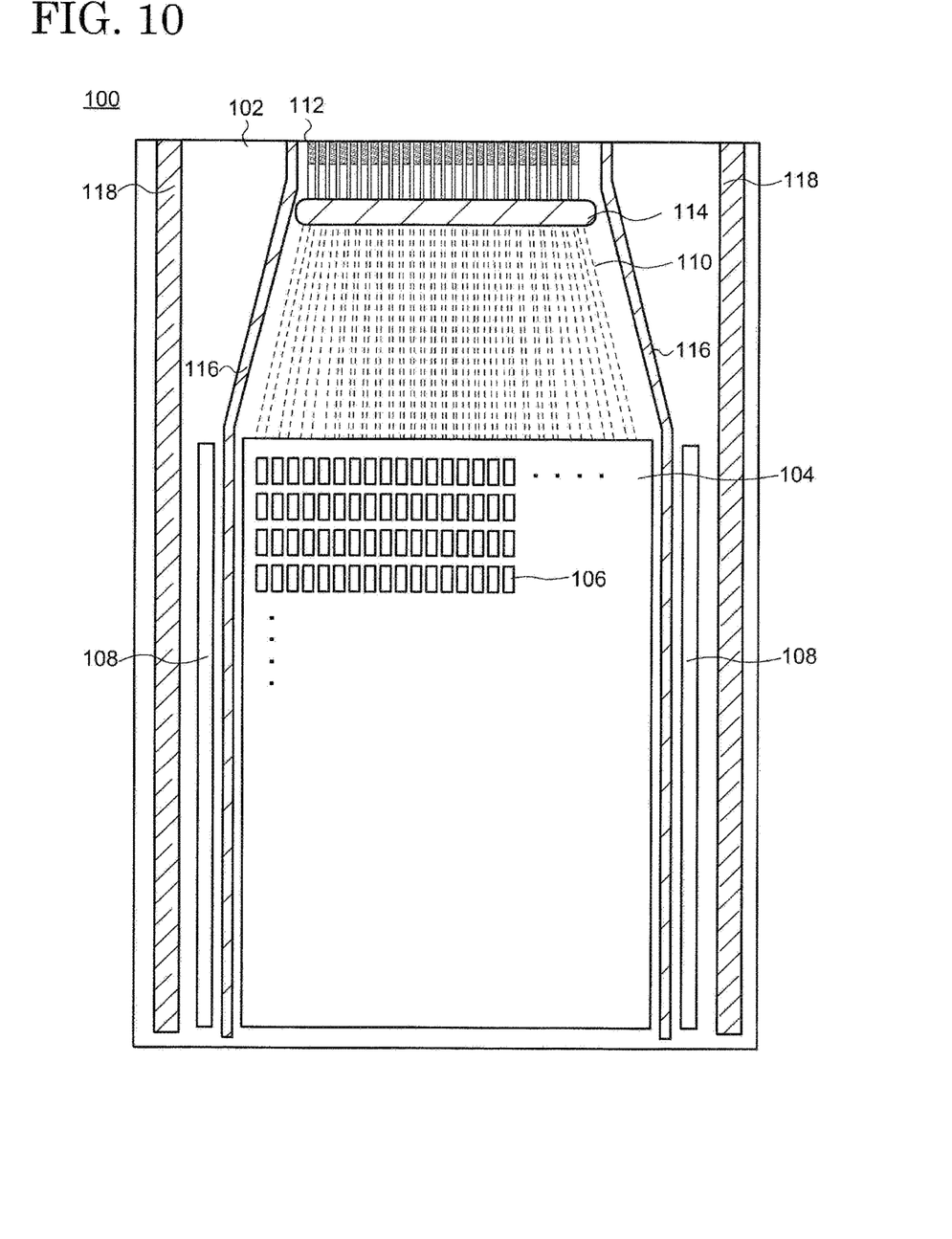
FIG. 10 is a top view of a display device according to an embodiment.

In the present embodiment, a display device according to an embodiment of the present invention is explained by using FIG. 9 and FIG. 10. Explanation of the structures which are the same as those of the First to Third Embodiments is omitted.

The metal films 118 of the present embodiment are different in plane layout from that of the First to Third Embodiments. Specifically, as shown in FIG. 9, the display device 100 is provided with a pair of metal films 118 so as to sandwich the display region 104. Alternatively, as shown in FIG. 10, the pair of metal films 118 is arranged so as to sandwich both of the wirings 110 and the display region 104.

When an image is reproduced on the display region 104, frequency of folding the display region 104 is relatively low generally. However, in the case where the display region 104 is unintentionally folded, that is, in the case where the display device 100 is folded so that the display region 104 is included in the bent region, even if the crack 180 is caused at the edge portion of the base material 102 close to the display region 104, extension of the crack 180 can be terminated or an extension rate of the crack 180 can be decreased. Accordingly, not only the wirings 110 but also the display region 104 can be prevented from being damaged, which enables production of a flexible display device with high reliability.

The aforementioned modes described as the embodiments of the present invention can be implemented by being appropriately combined with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although cases of the organic EL display device are exemplified, the embodiments can be applied to any kind of display devices of a flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by the persons ordinarily skilled in the art.

What is claimed is:

1. A display device comprising:
    a base material having an edge;
    a display region over the base material;
    a wiring over the base material, the wiring extending from the display region to an outside of the display region; and
    a metal film over the base material, wherein
    the edge of the base material is located at the outside the display region,
    the base material is configured to provide a bent region and two flat regions sandwiching the bent region, and
    the metal film continuously extends to the edge of the base material through the bent region and the two flat regions.
2. The display device according to claim 1, wherein the metal film intersects with an axis of the bent region.
3. The display device according to claim 1, wherein the metal film extends in a direction intersecting with an axis of the bent region.
4. The display device according to claim 1, wherein the metal film extends in a direction along an axis of the bent region.
5. The display device according to claim 1, wherein the metal film is arranged along the display region, and the wiring is arranged along the metal film and is located between the metal film and the display region.
6. The display device according to claim 1, wherein the metal film has a projected portion protruding toward the wiring, and
    at least a part of the projected portion overlaps with the wiring in a planar view.
7. The display device according to claim 1, wherein at least a part of the metal film is located in the bent region.
8. The display device according to claim 1, further comprising a terminal connected to the wiring, wherein
    the terminal is arranged along the edge of the base material,
    the metal film is located between the terminal and the display region, and
    the metal film overlaps with the wiring in a planar view.
9. The display device according to claim 1, wherein the metal film is electrically floated.

* * * * *